United States Patent
Takano et al.

(10) Patent No.: US 12,359,374 B2
(45) Date of Patent: Jul. 15, 2025

(54) FLAME-RESISTANT PAPER FOR RADIO WAVE ABSORBER MEMBER AND PRODUCTION METHOD FOR SAME

(71) Applicant: Toray Industries, Inc., Tokyo (JP)

(72) Inventors: Tomoko Takano, Otsu (JP); Hideaki Karasaki, Otsu (JP); Taira Omori, Nagoya (JP)

(73) Assignee: TORAY INDUSTRIES, INC., Tokyo (JP)

( * ) Notice: Subject to any disclaimer, the term of this patent is extended or adjusted under 35 U.S.C. 154(b) by 226 days.

(21) Appl. No.: 18/014,857

(22) PCT Filed: Jul. 8, 2021

(86) PCT No.: PCT/JP2021/025795
§ 371 (c)(1),
(2) Date: Jan. 6, 2023

(87) PCT Pub. No.: WO2022/014459
PCT Pub. Date: Jan. 20, 2022

(65) Prior Publication Data
US 2023/0323603 A1  Oct. 12, 2023

(30) Foreign Application Priority Data

Jul. 17, 2020  (JP) ................................ 2020-122561
Mar. 10, 2021  (JP) ................................ 2021-038011

(51) Int. Cl.
| | |
|---|---|
| *D21H 21/34* | (2006.01) |
| *D21H 17/00* | (2006.01) |
| *D21H 17/10* | (2006.01) |
| *D21H 17/36* | (2006.01) |
| *D21H 17/37* | (2006.01) |
| *D21H 17/67* | (2006.01) |
| *D21H 23/04* | (2006.01) |
| *D21H 23/24* | (2006.01) |
| *D21H 27/00* | (2006.01) |
| *G01R 29/08* | (2006.01) |
| *H01Q 17/00* | (2006.01) |

(52) U.S. Cl.
CPC ............ *D21H 21/34* (2013.01); *D21H 17/10* (2013.01); *D21H 17/36* (2013.01); *D21H 17/37* (2013.01); *D21H 17/675* (2013.01); *D21H 17/74* (2013.01); *D21H 23/04* (2013.01); *D21H 23/24* (2013.01); *D21H 27/00* (2013.01); *H01Q 17/00* (2013.01); *G01R 29/0821* (2013.01)

(58) Field of Classification Search
CPC ........ D21H 21/34; D21H 17/10; D21H 17/36; D21H 17/37; D21H 17/675; D21H 23/04; D21H 23/24; D21H 27/00; D21H 17/63; D21H 13/50; D21H 17/07; D21H 17/67; D21H 19/10; D21H 21/14; H01Q 17/00; H01Q 17/004; G01R 29/0821; H05K 9/00
See application file for complete search history.

(56) References Cited

U.S. PATENT DOCUMENTS

| | | | |
|---|---|---|---|
| 5,160,582 A | 11/1992 | Takahashi | |
| 2016/0137805 A1 | 5/2016 | Miura | |
| 2016/0208438 A1 | 7/2016 | Sugahara et al. | |
| 2020/0399833 A1* | 12/2020 | Karasaki | D21H 21/143 |

FOREIGN PATENT DOCUMENTS

| | | |
|---|---|---|
| CN | 104885586 A | 9/2015 |
| CN | 105308107 A | 2/2016 |
| JP | H03-130499 A | 6/1991 |
| JP | 2004-106513 A | 4/2004 |
| JP | 2013002003 A | 1/2013 |
| JP | 2020023759 A | 2/2020 |
| TW | 201938878 A | 10/2019 |
| WO | 2014/069461 A1 | 5/2014 |
| WO | 2017002863 A1 | 1/2017 |

OTHER PUBLICATIONS

International Search Report and Written Opinion for International Application No. PCT/JP2021/025795, dated Oct. 5, 2021, 5 pages.
Office Action (The First Office Action) issued Mar. 31, 2025, by the State Intellectual Property Office of People's Republic of China in corresponding Chinese Patent Application No. 202180047950.8 and an English translation of the Office Action. (11 pages).

* cited by examiner

*Primary Examiner* — Abbas Rashid
*Assistant Examiner* — Matthew M Eslami
(74) *Attorney, Agent, or Firm* — BUCHANAN INGERSOLL & ROONEY PC

(57) ABSTRACT

An object of the present invention is to provide, in particular, flame-resistant paper for a radio wave absorber member, the flame-resistant paper being unlikely to break during the production process and having favorable producibility in addition to being suitable for a radio wave absorber member and having high flame resistance. The flame-resistant paper for a radio wave absorber member according to the present invention contains pulp, aluminum hydroxide, guanidine phosphate, a binder, and a conductive substance, in which the content of the pulp is 5 to 20 mass %, the content of the aluminum hydroxide is 40 to 70 mass %, the content of the guanidine phosphate is 10 to 20 mass %, the content of the binder is 5 to 10 mass %, and the content of the conductive substance is 0.1 to 12 mass %.

8 Claims, No Drawings

FLAME-RESISTANT PAPER FOR RADIO WAVE ABSORBER MEMBER AND PRODUCTION METHOD FOR SAME

CROSS REFERENCE TO RELATED APPLICATIONS

This is the U.S. National Phase application of PCT/JP2021/025795, filed Jul. 8, 2021 which claims priority to Japanese Patent Application No. 2020-122561 filed Jul. 17, 2020, and Japanese Patent Application No. 2021-038011, filed Mar. 10, 2021, the disclosures of each of these applications being incorporated herein by reference in their entireties for all purposes.

FIELD OF THE INVENTION

The present invention relates to flame-resistant paper for a radio wave absorber member and a production method for the same.

BACKGROUND OF THE INVENTION

The radio wave absorber is used in an anechoic chamber, which is a facility for evaluating radio wave noise generated from various electronic devices and communication devices and evaluating whether there is no malfunction due to radio waves, in order to reduce radio wave hindrance such as radio wave interference. Furthermore, in recent years, it is also used in wireless communication systems such as ETC, wireless LAN, and automated driving systems.

Since these radio wave absorbers absorb radio waves by converting radio energy into thermal energy, there is the possibility that the radio wave absorbers burn when high-energy radio waves are applied. In particular, a radio wave absorber used in an anechoic chamber is also required to have flame resistance in order to ensure safety against a fire and the like.

As flame-resistant paper for a radio wave absorber member that has flame resistance, is hardly discolored over a long period of time, and does not show reduction in the flame resistance, flame-resistant paper for a radio wave absorber member containing a flame retardant composed of aluminum hydroxide powder and a polyborate salt and pulp has been proposed (see Patent Document 1).

In addition, flame-resistant paper containing pulp, aluminum hydroxide, a guanidine-based flame retardant, and a urethane resin has been proposed as flame-resistant paper that has flame resistance, hardly breaks, and has good producibility (see Patent Document 2).

PATENT DOCUMENTS

Patent Document 1: International Publication No. 2017/002863
Patent Document 2: Japanese Patent Laid-open Publication No. 2020-23759

SUMMARY OF THE INVENTION

According to the findings of the present inventors, the flame resistant paper for a radio wave absorber member (hereinafter may be simply referred to as "flame-resistant paper") proposed in Patent Document 1 described above has relatively low toughness. Therefore, there is a tendency that breakage of the flame-resistant paper occurs at the time of drying performed after impregnation treatment or coating treatment of the flame-resistant paper with a reagent solution containing a reagent, and at the time of secondary processing such as slitting of the flame-resistant paper or printing on the flame-resistant paper. In addition, there is a processing problem that the producibility of the flame-resistant paper is lowered due to the occurrence of breakage of the flame-resistant paper during the drying or the secondary processing.

Patent Document 2 discloses flame-resistant paper containing a urethane resin in addition to aluminum hydroxide and a guanidine-based flame retardant. Although the flame-resistant paper contains a urethane resin, its toughness is insufficient because the content of the urethane resin is small. In addition, the flame-resistant paper has insufficient tensile strength, and there is the problem that the flame-resistant paper easily breaks when tension is applied in the production process.

Therefore, an object of the present invention is to provide flame-resistant paper for a radio wave absorber member that is particularly suitable for a radio wave absorber member, has excellent flame resistance, has high tensile strength, is less likely to break, is less likely to break during the drying and during secondary processing such as slitting and printing, and has good producibility.

In order to achieve the above object, the present invention according to exemplary embodiments provides:

(1) flame-resistant paper for a radio wave absorber member containing pulp, aluminum hydroxide, guanidine phosphate, a binder, and a conductive substance, in which the content of the pulp is 5 to 20 mass %, the content of the aluminum hydroxide is 40 to 70 mass %, the content of the guanidine phosphate is 10 to 20 mass %, the content of the binder is 5 to 10 masse, and the content of the conductive substance is 0.1 to 12 mass %, and (2) a production method for the flame-resistant paper for a radio wave absorber member, including in this order:
preparing a slurry including pulp, aluminum hydroxide, a binder, and a conductive substance,
performing wet papermaking using the slurry to provide a flame-resistant paper base material for a radio wave absorber member, and
impregnating the flame-resistant paper base material for a radio wave absorber member with an aqueous solution containing guanidine phosphate.

With the present invention, flame-resistant paper for a radio wave absorber member that is suitable for a radio wave absorber member, has excellent flame resistance, has high tensile strength, is less likely to break, is less likely to break during drying and during secondary processing such as slitting and printing, and has good producibility can be provided.

DETAILED DESCRIPTION OF EMBODIMENTS OF THE INVENTION

An embodiment of the present invention will be described below.

Flame-resistant paper for a radio wave absorber member according to embodiments of the present invention contains pulp, aluminum hydroxide, guanidine phosphate, a binder, and a conductive substance, in which the content of the pulp is 5 to 20 mass %, the content of the aluminum hydroxide is 40 to 70 mass %, the content of the guanidine phosphate is 10 to 20 mass %, the content of the binder is 5 to 10 mass %, and the content of the conductive substance is 0.1 to 12 mass %.

The flame-resistant paper for a radio wave absorber member according to embodiments of the present invention employing the above configuration is therefore suitable for a radio wave absorber member, has excellent flame resistance, is less contaminated in a step in a reagent application step such as impregnation and coating, is less likely to break during drying and during secondary processing such as slitting and printing, and has good producibility.

The reason is presumed as follows. First, as will be described in detail below, in order to form the flame-resistant paper for a radio wave absorber member as paper, the flame-resistant paper for a radio wave absorber member needs to contain a specific amount or more of pulp. Pulp is a relatively flammable material. Therefore, in order to make the flame resistance of the flame-resistant paper for a radio wave absorber member sufficient, it is necessary to set the content of a flame retardant such as aluminum hydroxide and guanidine phosphate to a specific amount or more. On the other hand, when the content of the flame retardant in the flame-resistant paper for a radio wave absorber member increases, the tensile strength and toughness of the flame-resistant paper for a radio wave absorber member decrease. In the papermaking step and the reagent application step in which impregnation, coating, or the like is performed, drying is usually performed, but the decrease in tensile strength and toughness increases the frequency of occurrence of breakage of the flame-resistant paper for a radio wave absorber member during drying performed in these steps or during secondary processing such as slitting and printing. An increase in the frequency of occurrence of breakage of the flame-resistant paper for a radio wave absorber member due to such a decrease in tensile strength and toughness means that formability of the flame-resistant paper for a radio wave absorber member is deteriorated. On the other hand, when the frequency of occurrence of breakage of the flame-resistant paper for a radio wave absorber member is suppressed due to excellent tensile strength and toughness, formability is improved.

On the other hand, the flame-resistant paper for a radio wave absorber member in embodiments of the present invention contains a binder and further contains pulp, aluminum hydroxide, guanidine phosphate, and the binder in specific contents. Accordingly, the flame-resistant paper for a radio wave absorber member has higher tensile strength and toughness. As a result, it is presumed that since the flame-resistant paper for a radio wave absorber member has high levels of strength, toughness, and flame resistance as paper, the occurrence of breakage of the flame-resistant paper for a radio wave absorber member during drying or secondary processing in the papermaking step or the reagent application step is suppressed, and flame-resistant paper for a radio wave absorber member having excellent producibility and excellent flame resistance can be obtained. In addition, originally, the strength and toughness of the flame-resistant paper for a radio wave absorber member as paper and the flame resistance are in a trade-off relationship due to the above circumstances.

Examples of the pulp used in the flame-resistant paper for a radio wave absorber member according to embodiments of the present invention include pulp composed of plant fibers such as softwood pulp, hardwood pulp, thermomechanical pulp, ground pulp, linter pulp, and hemp pulp, pulp composed of regenerated fibers such as rayon, and synthetic fiber pulp composed of vinylon, polyester, and the like, and one or two or more of these pulps can be appropriately selected and used. Softwood pulp is preferable from the viewpoint of easily obtaining strength.

The flame-resistant paper for a radio wave absorber member according to embodiments of the present invention contains 5 to 20 mass % of pulp with respect to the entire flame-resistant paper for a radio wave absorber member. When the content of pulp is less than 5 mass %, the entanglement force of the pulp in the papermaking step becomes weak, and it becomes difficult to form a sheet state. On the other hand, when the content of pulp is more than 20 mass %, there is a tendency that sufficient flame resistance cannot be obtained as flame-resistant paper for a radio wave absorber member.

As described above, when the content of pulp is in the range of 5 to 20 mass %, a sheet having excellent flame resistance of the flame-resistant paper for a radio wave absorber member can be obtained. Among them, the content is preferably in the range of 10 to 18 mass %.

Next, the flame-resistant paper for a radio wave absorber member according to embodiments of the present invention contains 40 to 70 mass % of aluminum hydroxide. Since aluminum hydroxide is preferably carried in a state of being sufficiently dispersed throughout the flame-resistant paper for a radio wave absorber member, aluminum hydroxide is preferably powder.

Here, aluminum hydroxide is dehydrated and decomposed at a high temperature, and a flame retardant effect is obtained by an endothermic action at that time. This flame retardant effect does not decrease over time even after long-term storage, and the flame retardant effect imparted to the flame-resistant paper for a radio wave absorber member can be maintained for a long period of time.

In addition, by appropriately adding a papermaking reagent such as a yield improver composed of a cationic polymer compound or an anionic polymer compound and a paper strength agent at the time of papermaking of the flame-resistant paper for a radio wave absorber member, aluminum hydroxide is adsorbed by pulp, which further contributes to improvement of the flame resistance of the flame-resistant paper for a radio wave absorber member.

In addition, since aluminum hydroxide is white powder, the color of the flame-resistant paper for a radio wave absorber member containing aluminum hydroxide at a specific content or more is white. Therefore, when the flame-resistant paper for a radio wave absorber member according to embodiments of the present invention is used for a radio wave absorber for an anechoic chamber, the lighting effect in the room can be enhanced. Furthermore, since aluminum hydroxide does not change color and the flame-resistant paper for a radio wave absorber member can be kept white, in the present invention, it is important that the flame-resistant paper for a radio wave absorber member contain aluminum hydroxide.

When the content of aluminum hydroxide is less than 40 mass %, there is the possibility that sufficient flame resistance of the flame-resistant paper for a radio wave absorber member cannot be obtained.

On the other hand, when the content of aluminum hydroxide is more than 70 mass %, the flame-resistant paper for a radio wave absorber member can obtain high flame resistance, but the flame-resistant paper for a radio wave absorber member may be broken during drying in a reagent application step such as impregnation and coating and during secondary processing such as slitting and printing, leading to deterioration of handleability and process passability.

As described above, when the content of aluminum hydroxide is in the range of 40 to 70 mass %, flame-resistant paper for a radio wave absorber member having excellent flame resistance and retaining whiteness can be obtained.

Among them, the content is preferably in the range of 45 to 65 mass %. Aluminum hydroxide can be purchased from Wako Pure Chemical Industries, Ltd., Sigma-Aldrich Japan K.K., and the like.

The flame-resistant paper for a radio wave absorber member according to embodiments of the present invention contains 10 to 20 mass % of guanidine phosphate with respect to the entire flame-resistant paper for a radio wave absorber member. In general, when the required amount of the flame retardant is large, the toughness of the flame-resistant paper for a radio wave absorber member is deteriorated, and thus the flame-resistant paper for a radio wave absorber member tends to be easily broken during drying in the reagent application step by impregnation or coating or during secondary processing such as slitting and printing. In addition, the tendency of decreasing the tensile strength of the flame-resistant paper for a radio wave absorber member is smaller for guanidine phosphate than for aluminum hydroxide. Therefore, in order to achieve both excellent flame resistance of the flame-resistant paper for a radio wave absorber member and suppression of breakage of the flame-resistant paper for a radio wave absorber member, it is important that the flame-resistant paper for a radio wave absorber member according to embodiments of the present invention contain guanidine phosphate in addition to aluminum hydroxide. In addition, it is necessary to use guanidine phosphate from the viewpoints that high flame resistance of the flame-resistant paper for a radio wave absorber member can be achieved with a small content, there is no decrease in flame resistance over time due to hydrolysis, and discoloration due to change over time is small.

When the content of guanidine phosphate in the entire flame-resistant paper for a radio wave absorber member is less than 10 mass %, the flame resistance of a member obtained by bonding the flame-resistant paper for a radio wave absorber member and polystyrene foam tends to be insufficient.

On the other hand, when the content of guanidine phosphate in the entire flame-resistant paper for a radio wave absorber member is more than 20 mass %, the flame-resistant paper for a radio wave absorber member may be broken during drying in the reagent application step such as impregnation and coating and during secondary processing such as slitting and printing, leading to deterioration of handleability and process passability. In addition, when used as flame-resistant paper for a radio wave absorber member, discoloration due to a change with time becomes remarkably conspicuous. From the above viewpoint, the content of guanidine phosphate is more preferably 15 mass or less.

The flame-resistant paper for a radio wave absorber member according to embodiments of the present invention contains 5 to 10 mass % of a binder with respect to the entire flame-resistant paper for a radio wave absorber member. It is preferable to contain 8 to 10 mass % of the binder. When the binder is contained in the flame-resistant paper for a radio wave absorber member, tensile strength and toughness can be improved, and further, falling of aluminum hydroxide from the flame-resistant paper for a radio wave absorber member can be suppressed. Therefore, it is possible to realize high producibility by suppressing breakage of the flame-resistant paper for a radio wave absorber member during drying in the papermaking step or the reagent application step and during secondary processing such as slitting and printing and to realize high flame resistance of the flame-resistant paper for a radio wave absorber member.

When the content of the binder in the entire flame-resistant paper for a radio wave absorber member is less than 5 mass %, the flame-resistant paper for a radio wave absorber member may be broken during drying in the papermaking step or the reagent application step and during secondary processing such as slitting and printing, leading to deterioration of handleability and process passability.

On the other hand, when the content of the binder with respect to the entire flame-resistant paper for a radio wave absorber member is more than 10 mass %, the flame resistance may decrease due to the influence of the binder.

Here, the binder used in the present invention is not particularly limited, and examples thereof include organic binders such as polyvinyl alcohol resin, vinyl acetate resin, acrylic resin, urea resin, epoxy resin, styrene-acrylic copolymer resin, polyester resin, and polyolefin resin, and inorganic binders such as alumina sol and silica sol. One of these binders exemplified and listed above can be used as the binder, or a mixture of two or more of these binders can be used as the binder. Among them, the binder is preferably at least one selected from the group consisting of polyvinyl alcohol resin, acrylic resin, and styrene-acrylic copolymer resin, from the viewpoint of high hydrophilicity and excellent papermaking properties.

Examples of the form of the binder used as a raw material include a liquid binder such as an emulsion and a solution, and a fibrous or powdery solid binder. Among them, a fibrous binder is preferably contained in at least a part from the viewpoint of hardly hindering contact between conductive substances and exhibiting excellent radio wave absorption performance. As the fibrous binder, a single-component fibrous binder, or a composite fibrous binder such as a core-sheath type composite fiber containing a high melting point polymer as a core component and a low melting point polymer as a sheath component and a bimetal type composite fiber in which a high melting point polymer and a low melting point polymer are arranged in parallel with each other can be used. When the fibrous binder and the liquid or powdery solid binder are used in combination, the liquid binder or the powdery solid binder adheres to the vicinity of the intersection of the fibers in addition to the adhesion between the fibers by the fibrous binder, which is more preferable in that the adhesive strength can be further increased.

Here, it is preferable that the mass ratio of aluminum hydroxide to the binder (content of aluminum hydroxide/content of binder) be 83/17 to 91/9, and the ratio of the total content of aluminum hydroxide and guanidine phosphate to the total content of pulp and the binder (content of aluminum hydroxide+content of guanidine phosphate)/(content of pulp+content of binder) be 67/33 to 80/20. The mass ratios are rounded off to whole numbers. The flame-resistant paper for a radio wave absorber member having the above characteristics can achieve both excellent papermaking properties and excellent flame resistance and is also excellent in handleability. Here, the excellent handleability specifically means that the occurrence of breakage in the flame-resistant paper for a radio wave absorber member is suppressed in the step of applying a reagent to the flame-resistant paper for a radio wave absorber member, the step of providing a slit, and the step of printing.

The flame-resistant paper for a radio wave absorber member according to embodiments of the present invention may contain inorganic fibers such as glass fibers, rock wool, and basalt fibers. Since these are inorganic fibers, the flame resistance of the flame-resistant paper for a radio wave absorber member can be improved, and since these are fibers having high rigidity, high rigidity can be exhibited in the flame-resistant paper for a radio wave absorber member, and the handleability of the flame-resistant paper for a radio wave absorber member can be improved. The content of the inorganic fiber is preferably in the range of 1 to 30 mass % when the entire paper of the flame-resistant paper for a radio wave absorber member according to embodiments of the present invention is 100 mass %. The content is more preferably 15 mass % or less. Within this range, flame-resistant paper for a radio wave absorber member having high rigidity can be stably produced.

The flame-resistant paper for a radio wave absorber member according to embodiments of the present invention contains 0.1 to 12 mass % of a conductive substance with respect to the entire flame-resistant paper for a radio wave absorber member. Furthermore, the content is preferably 4 mass % or less, more preferably 3 mass % or less. The conductive substance in the present invention is a material that converts radio energy into a minute current and then into thermal energy to perform an attenuation action of radio waves, that is, absorption of radio waves. Examples of the conductive substance include conductive particles and conductive fibers. Here, examples of the conductive particles include metal particles, carbon black particles, carbon nanotube particles, carbon microcoil particles, and graphite particles. Examples of the conductive fibers include carbon fibers and metal fibers, and examples of the metal fibers include stainless steel fibers, copper fibers, silver fibers, gold fibers, nickel fibers, aluminum fibers, and iron fibers. In addition, a material obtained by imparting conductivity to nonconductive particles and fibers by plating, vapor deposition, thermal spraying, or the like of metal can also be mentioned as the conductive substance.

Among these conductive substances, conductive fibers are preferably used, and among the conductive fibers, conductive short fibers are more preferably used from the viewpoint of uniform dispersion. Since conductive short fibers have a large aspect ratio, the fibers easily come into contact with each other, and radio wave absorption performance can be effectively obtained even in a small amount as compared with powder. Among conductive short fibers, carbon fibers are particularly preferably used because the fibers are rigid and easy to be oriented in a base material and because there is almost no change in performance in long-term use. For the conductive short fibers, the length of the conductive short fibers is preferably 0.1 mm or more, more preferably 1.0 mm or more, from the viewpoint of ease of contact between fibers and dispersibility of slurry in a papermaking production process described later. On the other hand, the length is preferably 15.0 mm or less, more preferably 10.0 mm or less.

When the flame-resistant paper for a radio wave absorber member is used in an anechoic chamber or the like, the content of the conductive fibers is preferably 0.5 to 2 mass %, and the relative permittivity of the flame-resistant paper for a radio wave absorber member is preferably 10 to 250. When the content of the conductive fibers is 0.5 mass % or more, more excellent radio wave absorption performance can be obtained. On the other hand, when the content of the conductive fibers is 2 mass % or less, reflection of radio waves is suppressed, and thus radio wave absorption performance is superior.

When the flame-resistant paper for a radio wave absorber member is used in a noise suppression sheet that absorbs electromagnetic noise generated from a small electronic device or the like, the content of the conductive fibers is preferably 5 to 12 mass %, and the transmission attenuation factor of the flame-resistant paper for a radio wave absorber member is preferably 20 dB or more. When the content of the conductive fibers is 5 to 12 mass %, a more excellent noise suppression effect can be obtained. In particular, the content of the conductive fibers is 5 to 10 mass %.

The basis weight of the flame-resistant paper for a radio wave absorber member of the present invention is preferably in the range of 50 to 200 $g/m^2$. When the content of the conductive substance is 0.1 to 12 mass % and the basis weight is within the above range, good radio wave absorption characteristics can be obtained. Furthermore, when the basis weight is within this range, the tensile strength and toughness of the flame-resistant paper for a radio wave absorber member are improved, and breakage of the flame-resistant paper can be suppressed during drying in the papermaking step or the reagent application step and during secondary processing such as slitting and printing. The basis weight is more preferably 80 $g/m^2$ or more. On the other hand, the basis weight is more preferably 150 $g/m^2$ or less.

Next, a production method for flame-resistant paper for a radio wave absorber member according to the present invention will be described.

Examples of the production method for flame-resistant paper for a radio wave absorber member according to embodiments of the present invention include a method including the steps of, in this order: performing wet papermaking of pulp, aluminum hydroxide, a binder, and a conductive substance so that the content of the pulp is 5 to 20 mass %, the content of aluminum hydroxide is 40 to 70 mass %, the content of the binder is 5 to 10 masse, and the content of the conductive substance is 0.1 to 12 mass % with respect to the flame-resistant paper for a radio wave absorber member to provide a flame-resistant paper base material for a radio wave absorber member; and applying guanidine phosphate to the flame-resistant paper base material for a radio wave absorber member so that the content of guanidine phosphate with respect to the flame-resistant paper for a radio wave absorber member is 10 to 20 mass %. That is, the production method for flame-resistant paper for a radio wave absorber member according to embodiments of the present invention includes, in this order: preparing a slurry including pulp, aluminum hydroxide, a binder, and a conductive substance; performing wet papermaking using the slurry to provide a flame-resistant paper base material for a radio wave absorber member; and impregnating the flame-resistant paper base material for a radio wave absorber member with an aqueous solution containing guanidine phosphate.

Here, when the amount of the binder contained in the flame-resistant paper base material for a radio wave absorber member is increased, the tensile strength of the flame-resistant paper tends to be improved, but in general, when the amount of the binder is increased, the flame resistance of the flame-resistant paper is reduced, so that there is a trade-off relationship between the improvement of the tensile strength and the flame resistance of the flame-resistant paper. However, in the step of performing wet papermaking with a slurry to provide a flame-resistant paper base material for a radio wave absorber member, if slurry contains a binder, the paper strength of the flame-resistant paper can be improved even with a small amount of the binder. Furthermore, since the binder is also contained in the flame-resistant paper base material for a radio wave absorber member, breakage of the flame-resistant paper for a radio wave absorber member can be suppressed even in all of the step of providing guanidine phosphate and the secondary processing step such as printing other than the step of providing a base material such as wet papermaking.

Examples of the method for adding the conductive fiber to the flame-resistant paper for a radio wave absorber member include a method in which a slurry used for wet papermaking contains the conductive fiber to incorporate the conductive fiber into the flame-resistant paper base material for a radio wave absorber member as described above, a method in which the conductive fiber is mixed with a material of a binder and applied to the flame-resistant paper base material for a radio wave absorber member using a device such as a size press coater, a roll coater, a blade coater, a bar coater, and an air knife coater, and a method in which the flame-resistant paper base material for a radio wave absorber member is impregnated with an aqueous solution in which the conductive fiber is dispersed. Among them, since the conductive fiber contained in the flame-resistant paper for a radio wave absorber member can be uniformly dispersed in the flame-resistant paper for a radio wave absorber member, the method is preferable in which the slurry used for wet papermaking contains the conductive fiber to incorporate the conductive fiber into the flame-resistant paper for a radio wave absorber member.

As a production method for flame-resistant paper for a radio wave absorber member of the present invention, as an example, a method by papermaking using a known paper material can be used. The method is a wet papermaking method in which fiber (pulp), aluminum hydroxide, a binder, a conductive substance, and the like, which are constituent materials of the flame-resistant paper for a radio wave absorber member of the present invention, are mixed with water to form a slurry, and the slurry is subjected to papermaking using a paper machine.

As the paper machine, any paper machine such as a cylinder wire, a short-fourdrinier wire, a Fourdrinier, a birch former, Rotoformer, and a hydroformer can be used. As the dryer, any dryer such as a Yankee type, a multi-cylinder type, and a through type can be used.

Furthermore, the method for incorporating guanidine phosphate into the flame-resistant paper for a radio wave absorber member is not particularly limited. Examples thereof include impregnation by a dip/mangle, impregnation application, and coating application. For the impregnation application and the coating application, a coating device such as a size press coater, a roll coater, a blade coater, a bar coater, and an air knife coater can be used, and these devices can be used on-machine or off-machine. Among them, impregnation by a dip/mangle is preferable because the impregnation is easily performed with a uniform impregnation amount on the entire flame-resistant paper for a radio wave absorber member.

One of the major characteristics of the production method for a flame-resistant paper for a radio wave absorber member according to embodiments of the present invention is that a flame-resistant paper base material for a radio wave absorber member containing a binder is obtained, and then the flame-resistant paper base material for a radio wave absorber member is impregnated with an aqueous solution containing guanidine phosphate to apply guanidine phosphate to the flame-resistant paper base material for a radio wave absorber member. By applying guanidine phosphate to the flame-resistant paper base material for a radio wave absorber member after obtaining the flame-resistant paper base material for a radio wave absorber member containing a binder as described above, breakage in papermaking during drying can be further suppressed, and in the step of applying guanidine phosphate, it is possible to suppress adhesion of the binder to a roll in addition to guanidine phosphate. It is also possible to apply a binder such as a polyurethane resin together with guanidine phosphate. However, as will be described later, the flame-resistant paper base material for a radio wave absorber member impregnated with a solution containing guanidine phosphate and the binder is likely to adhere to a surface of a roll or the like when the flame-resistant paper base material for a radio wave absorber member is pressurized and dehydrated between a pair of rolls or between flat plates in this method, and the method described above is therefore preferably employed. When the binder is attached to the roll, the binder attached to the roll is dried and fixed to the roll, whereby the roll is contaminated, and the producibility of the flame-resistant paper for a radio wave absorber member tends to decrease. Therefore, this point is desirably noted when this method is employed.

Here, the temperature of the aqueous solution containing guanidine phosphate is preferably 40° C. to 70° C. The temperature is more preferably 45 to 65° C. When the temperature is lower than 40° C., guanidine phosphate is precipitated and the like, and it is difficult to perform stable processing. On the other hand, when the temperature is higher than 70° C., there is the possibility that the base material is likely to be broken because the binder or the like in the flame-resistant paper base material for a radio wave absorber member is eluted or softened when impregnated in the aqueous solution, and in addition, there is the possibility that moisture evaporates to make it difficult to keep the concentration of the guanidine phosphate aqueous solution constant.

In addition, after the step of impregnating the flame-resistant paper base material for a radio wave absorber member with the aqueous solution containing guanidine phosphate, the step of pressurizing the flame-resistant paper base material for a radio wave absorber member and the step of drying the flame-resistant paper base material for a radio wave absorber member at a temperature of 80 to 170° C. are preferably included in this order. The drying temperature is more preferably 100 to 160° C. from the viewpoint that the efficiency of drying moisture is good.

Hereinafter, the step of pressurizing the flame-resistant paper base material for a radio wave absorber member will be described. It is preferable that the flame-resistant paper for a radio wave absorber member be impregnated with the aqueous solution of guanidine phosphate and then pressurized and dehydrated between a pair of rolls or flat plates. Among them, it is preferable to perform dehydration by pressurization through between a pair of rolls from the viewpoint of providing better process passability than in the case of flat plates. By pressurization and dehydration, the impregnation amount of guanidine phosphate can be maintained at a constant amount, and further, the amount of moisture contained in the flame-resistant paper base material for a radio wave absorber member is reduced by dehydration, so that drying efficiency is increased. The pressure applied is preferably 20 kgf/cm (196 N/cm) to 300 kgf/cm (2.94 kN/cm), more preferably 30 kgf/cm (294 N/cm) to 150 kgf/cm (1.47 N/cm). If it is lower than 20 kgf/cm (196 N/cm), there is the possibility that dehydration cannot be sufficiently performed. If it is higher than 300 kgf/cm (2.94 kN/cm), wrinkles tend to be formed. The material of the rolls is not particularly limited and may be a metal roll, a rubber roll, a paper roll, or the like. At least one of the rolls is preferably a rubber roll from the viewpoint of reducing the effects of irregularities or the like of the flame-resistant paper for a radio wave absorber member and uniformly applying pressure.

Hereinafter, the step of drying the flame-resistant paper base material for a radio wave absorber member at a temperature of 80 to 170° C. will be described. The dryer may be any dryer of a steam cylinder type such as a Yankee drum type and a multi-cylinder type, an infrared type, a hot air type, and the like. In the steam cylinder type, since the flame-resistant paper for a radio wave absorber member in a wet state directly comes into contact with a high-temperature cylinder, migration such as aggregation of guanidine phosphate is likely to occur in the contact portion. Further, the obtained flame-resistant paper for a radio wave absorber member has low toughness and tends to be easily broken or easily wrinkled. On the other hand, an infrared type dryer or an air-through type dryer is preferable because the obtained flame-resistant paper for a radio wave absorber member has a small difference between the front and back sides and is less likely to be broken because toughness is less likely to decrease. Here, the infrared type dryer may be either an electric infrared dryer or a gas infrared dryer and refers to a dryer that dries the flame-resistant paper for a radio wave absorber member by applying infrared rays. In addition, the air-through type dryer refers to a dryer that performs drying by fire, an electric heater, steam, or the like directly or by air heated by heat exchange.

The drying temperature is desirably 80 to 170° C. When the drying temperature is 80° C. or higher, the flame-resistant paper base material for a radio wave absorber member can be sufficiently dried. On the other hand, when the drying temperature is 170° C. or lower, it is possible to suppress breakage of the flame-resistant paper base material for a radio wave absorber member due to excessive drying, further, it is possible to suppress occurrence of yellowing or the like of pulp, and as a result, it is possible to suppress yellowing of the flame-resistant paper for a radio wave absorber member.

EXAMPLES

Next, the flame-resistant paper according to embodiments of the present invention will be described in more detail with reference to Examples. Performance values in Examples were measured by the following methods.

[Measurement Methods]

(1) Confirmation of Components Contained in Flame-Resistant Paper

The components contained in the flame-resistant paper are confirmed as follows. That is, using an ultra-high resolution field emission scanning electron microscope (SEM, SU-8010 manufactured by Hitachi High-Technologies Corporation), a total of 5 regions including 4 region points in peripheral regions of points shifted by 2.5 cm in the longitudinal and transverse directions from 4 corners of a test piece of 10 cm×10 cm flame-resistant paper toward the center of the test piece and 1 region in a peripheral region of 1 point in the central portion of the test piece are photographed, the presence of a specific element is confirmed by an energy dispersive X-ray analyzer (EDX), and the components contained in the flame-resistant paper and the contents thereof are confirmed together with the result of measurement of the test piece using an infrared spectrophotometer (FT-IR, IR PRESTIGE-21 manufactured by Shimadzu Corporation).

(2) Basis Weight of Flame-Resistant Paper

Each of 5 sheets of flame-resistant paper are cut into a 300 mm square, the mass is measured and converted into the mass per 1 m², and the average is taken to calculate the basis weight.

(3) Flame Resistance of Flame-Resistant Paper

Evaluation is made based on 20 mm Vertical Burning Test (UL94 V-0) in the UL94 Safety Standard ("Tests for Flammability of Plastic Materials for Parts in Devices and Appliances"). Here, UL is a safety standard for electronic devices established and permitted by Underwriters Laboratories Inc., USA, and UL94 is also a standard for flame resistance. Evaluation was performed by taking 5 strip-shaped samples having a width of 13 mm and a length of 125 mm.

⊙: There is no sample that continues to burn for 10 seconds or more for all 5 samples, a total burning time for contact with flame for 10 times for 5 samples does not exceed 50 seconds, there is no sample that burns to the position of the fixing clamp, and there is no sample that continues to be red-hot for 30 seconds or more after the second contact with flame.

x: One or more of the 5 samples continue to burn for 10 seconds or more, a total burning time for contact with flame for 10 times for 5 samples is 50 seconds or more, one or more samples burn to the position of the fixing clamp, or one or more samples continue to be red-hot for 30 seconds or more after the second contact with flame.

(4) Flame Resistance of Member Obtained by Bonding Flame-Resistant Paper for Radio Wave Absorber Member and Polystyrene Foam (Flame Resistance of Bonded Product)

Flame-resistant paper and polystyrene foam having a thickness of 10 mm are bonded to each other with a double-sided adhesive tape (recycled paper double-sided adhesive tape NWBB-15, manufactured by Nichiban Co., Ltd.) to produce a member in which the flame-resistant paper and the polystyrene foam are bonded to each other. The size of the sample was 50 mm in width and 150 mm in length, and 5 samples were prepared in which lines were drawn at positions of 25 mm and 125 mm from one end along the length direction.

The burning rates of the above members are evaluated according to Horizontal Flammability Test for Foamed Material (UL94 HBF) in the UL94 Safety Standard ("Tests for Flammability of Plastic Materials for Parts in Devices and Appliances").

⊙: For all 5 levels, the burning time in 100 mm (25 mm line to 125 mm line) is measured, the burning rate is calculated, and there must be no sample burning at a burning rate greater than 40 mm/min. Alternatively, it must be a sample that is extinguished before the combustion or the origin of fire reach the 125 mm line. In addition, the average value of the burning rates of the burned samples must be less than 35 mm/min.

○: For all 5 levels, the burning time in 100 mm (25 mm line to 125 mm line) is measured, the burning rate is calculated, and there must be no sample burning at a burning rate greater than 40 mm/min. Alternatively, it must be a sample that is extinguished before the combustion or the origin of fire reach the 125 mm line. In addition, the average value of the burning rates of the burned samples must be 35 mm/min or more and 40 mm/min or less.

x: At least one of the five fibers does not satisfy the criteria of ⊙ and/or ○.

(5) Tensile Strength

In accordance with JIS P 8113:2006, using a tensile tester "Autograph, model number: AGS-J" (manufactured by Shimadzu Corporation), 3 sheets were cut into a strip shape of 15 mm×150 mm with an MD direction (direction in which paper flows during papermaking) as long sides, and 3 sheets were cut into a strip shape of 15 mm×150 mm with a TD direction (direction substantially perpendicular to the MD direction) as long sides to provide test pieces. These were pulled at a constant speed with a distance between chucks set to 100 mm and a moving speed of the chucks set to 100 mm/min, the strength when the test piece was broken was measured, the total average was calculated, and from the viewpoint of stable producibility and handleability, the results were classified as follows.

O: 30 N/15 mm or more
Δ: 12 N/15 mm or more and less than 30 N/15 mm
x: less than 12 N/15 mm (6) Relative Permittivity On an upper surface of an aluminum plate of 30 cm long×30 cm wide×5 mm thick, a spacer (14 mm thick) made of polystyrene foam having the same size and the same shape as those of the aluminum plate and an expansion ratio of 70 times was placed, a sheet material for a radio wave absorber having the same size as that of the aluminum plate was further placed on the spacer, a transmission and reception antenna was set at a position immediately above the center point (intersection of 2 diagonal lines of the polystyrene foam spacer on the surface opposite to the surface on the aluminum plate side of the polystyrene foam spacer) of the spacer made of polystyrene foam at a distance of 1.4 m so that an incident angle of a radio wave was 7°, a radio wave in a frequency range of 2 to 4 GHz was incident on a sample, and an input impedance was measured using a vector network analyzer (model: N5230, manufactured by Agilent Technologies, Inc.). Thereafter, the sheet material for a radio wave absorber was removed, the input impedance in a state where the sheet material for a radio wave absorber was removed was measured in the same manner as described above, the complex relative permittivity of the sheet material for a radio wave absorber was calculated from the difference in the input impedance between the case where the sheet material for a radio wave absorber was present and the case where the sheet material for a radio wave absorber was not present, and the real part εr' of the complex relative permittivity at a frequency of 3 GHZ was read. In the measurement, different sheet materials for a radio wave absorber were used with N=3, and for each sheet material for a radio wave absorber, the real part εr' of the complex relative permittivity in the direction parallel to any one side thereof and the direction perpendicular to the one side was measured, and the average value of the obtained six measured values was taken as the relative permittivity of the real part εr' of the complex relative permittivity.

(7) Transmission Attenuation Factor

Evaluation was made in accordance with Section 4.3 "Transmission attenuation power ratio: Rtp" in IEC standard 62333-2 "Noise suppression sheet for digital devices and equipment". This evaluation method is performed using a microstrip line (MSL) jig, and a noise suppression sheet is placed on the MSL to measure a conduction noise suppression system Rtp (dB). Measurement was performed in a frequency range of 4 to 6 GHz using a vector network analyzer (model: N5230, manufactured by Agilent Technologies, Inc.), a frequency of 5 GHz was read, and a value of 20 dB or more was judged as ◯, a value of 3 dB or more and less than 20 dB was judged as Δ, and a value of less than 3 dB was judged as x. The size of the noise suppression sheet sample was 10 cm×5 cm.

(8) Papermaking Productivity

In the case of wet papermaking using the continuous papermaking method, stable continuous productivity was examined by the following evaluation.

A: Papermaking production was stably performed.
B: During papermaking, paper was sometimes broken, or guanidine phosphate was attached to coating equipment, impregnation equipment, and/or a drying roll, and stable papermaking production was not possible.
B−: During papermaking, paper was sometimes broken, or guanidine phosphate was attached to coating equipment, impregnation equipment, and/or a drying roll, the frequency of breakage and/or the degree of attachment of guanidine phosphate was higher than B, and stable papermaking production was not possible.
C: The tensile strength was weak, and the paper was frequently broken during papermaking, the guanidine phosphate application process, and the winding step.

Example 1

A flame-resistant paper base material for a radio wave absorber member was prepared by mixing 18 mass % of softwood pulp having a fiber length of 5 mm as pulp, 48 mass % of aluminum hydroxide (manufactured by Wako Pure Chemical Industries, Ltd.), 10 mass % of glass fiber (fiber diameter: 7 μm, fiber length: 6 mm), 8 mass % of polyvinyl alcohol fiber ("Vinylon" manufactured by Kuraray Co., Ltd., fiber diameter: 11 μm, fiber length: 3 mm) and 2 mass % of a styrene-acrylic copolymer resin (aqueous emulsion, manufactured by Toagosei Co., Ltd.) in terms of the solid content as binders (the binders was 10 mass %), and 1 mass % of carbon fiber ("Torayca" manufactured by Toray Industries, Inc., fiber diameter: 7 μm, fiber length: 6 mm) as a conductive substance with respect to flame-resistant paper for a radio wave absorber member, and performing wet papermaking by a continuous papermaking method.

The flame-resistant paper base material for a radio wave absorber member was impregnated with a guanidine phosphate aqueous solution (liquid temperature: 55° C.) by a size press coater such that guanidine phosphate ("Non-nen" (registered trademark) 985 manufactured by Marubishi Oil Chemical Corporation) was 13 mass % with respect to the entire flame-resistant paper, and dried by a gas type infrared dryer (drying temperature: 150° C.) to provide flame-resistant paper for a radio wave absorber member having a basis weight of 115 g/m². Papermaking productivity was judged as A.

The obtained flame-resistant paper for a radio wave absorber member was evaluated. The results are shown in Table 1. The flame-resistant paper for a radio wave absorber member had a low burning rate and passed UL94 V-0 (evaluation was ◉). In addition, the burning rate of the member bonded to polystyrene foam was also slow, and the member passed UL94 HBF (evaluation was ◉). In addition, the tensile strength was also sufficient. The relative permittivity was 130 and was suitable as a radio wave absorber, but the performance of the transmission attenuation factor was low, and the noise suppression effect was Δ.

Example 2

Flame-resistant paper for a radio wave absorber member of Example 2 having a basis weight of 115 g/m² was obtained in the same manner as in Example 1 except that the content of pulp was changed to 15 mass %, the content of aluminum hydroxide was changed to 45 mass %, the content of glass fiber was changed to 15 mass %, the contents of polyvinyl alcohol fiber and the styrene-acrylic copolymer resin were changed to 7 mass % and 2 mass %, respectively, as binders (the content of the binders was changed to 9 mass %), and the content of guanidine phosphate was changed to 15 mass %. Papermaking productivity was judged as A.

The obtained flame-resistant paper for a radio wave absorber member was evaluated. The results are shown in Table 1. The flame-resistant paper for a radio wave absorber member had a low burning rate and passed UL94 V-0 (evaluation was ⊙). In addition, the burning rate of the member bonded to polystyrene foam was also slow, and the member passed UL94 HBF (evaluation was ⊙). In addition, the tensile strength was also sufficient. The relative permittivity was 130 and was suitable as a radio wave absorber, but the performance of the transmission attenuation factor was low, and the noise suppression effect was Δ.

Example 3

Flame-resistant paper for a radio wave absorber member of Example 3 having a basis weight of 115 g/m² was obtained in the same manner as in Example 1 except that the content of pulp was changed to 10 mass %, the content of aluminum hydroxide was changed to 65 mass %, the content of glass fiber was changed to 5 mass %, the contents of polyvinyl alcohol fiber and the styrene-acrylic copolymer resin were changed to 7 mass % and 2 mass %, respectively, as binders (the content of the binders was changed to 9 mass %), and the content of guanidine phosphate was changed to 10 mass %. Papermaking productivity was judged as A.

The obtained flame-resistant paper for a radio wave absorber member was evaluated. The results are shown in Table 1. The flame-resistant paper for a radio wave absorber member had a low burning rate and passed UL94 V-0 (evaluation was ⊙). In addition, the burning rate of the member bonded to polystyrene foam was also slow, and the member passed UL94 HBF (evaluation was ⊙). In addition, the tensile strength was also sufficient. The relative permittivity was 130 and was suitable as a radio wave absorber, but the performance of the transmission attenuation factor was low, and the noise suppression effect was Δ.

Example 4

Flame-resistant paper for a radio wave absorber member of Example 4 having a basis weight of 115 g/m² was obtained in the same manner as in Example 1 except that the content of pulp was changed to 15 mass %, the content of aluminum hydroxide was changed to 55 mass %, the content of glass fiber was changed to 8 mass %, the contents of polyvinyl alcohol fiber and the styrene-acrylic copolymer resin were changed to 5 mass % and 1 mass %, respectively, as binders (the content of the binders was changed to 6 mass %), and the content of guanidine phosphate was changed to 15 mass %. Papermaking productivity was judged as A.

The obtained flame-resistant paper for a radio wave absorber member was evaluated. The results are shown in Table 1. The flame-resistant paper for a radio wave absorber member had a low burning rate and passed UL94 V-0 (evaluation was ⊙). In addition, the burning rate of the member bonded to polystyrene foam was also slow, and the member passed UL94 HBF (evaluation was ⊙). In addition, the tensile strength was also sufficient. The relative permittivity was 130 and was suitable as a radio wave absorber, but the performance of the transmission attenuation factor was low, and the noise suppression effect was Δ.

Example 5

Flame-resistant paper for a radio wave absorber member of Example 5 having a basis weight of 85 g/m² was obtained in the same manner as in Example 1 except that the content of pulp was changed to 12 mass %, the content of aluminum hydroxide was changed to 52 mass %, the content of glass fiber was changed to 8 mass %, the contents of polyvinyl alcohol fiber and the styrene-acrylic copolymer resin were changed to 8 mass % and 1 mass %, respectively, as binders (the content of the binders was changed to 9 mass %), and the content of guanidine phosphate was changed to 18 mass %. Papermaking productivity was judged as A.

The obtained flame-resistant paper for a radio wave absorber member was evaluated. The results are shown in Table 1. The flame-resistant paper for a radio wave absorber member had a low burning rate and passed UL94 V-0 (evaluation was ⊙). In addition, the burning rate of the member bonded to polystyrene foam was also slow, and the member passed UL94 HBF (evaluation was ○). In addition, the tensile strength was also sufficient. The relative permittivity was 130 and was suitable as a radio wave absorber, but the performance of the transmission attenuation factor was low, and the noise suppression effect was Δ.

Example 6

Flame-resistant paper for a radio wave absorber member of Example 6 was obtained in the same manner as in Example 5 except that the basis weight was changed to 74 g/m². The paper was slightly easy to break, and papermaking productivity was judged as B.

The obtained flame-resistant paper for a radio wave absorber member was evaluated. The results are shown in Table 1. The flame-resistant paper had a low burning rate and passed UL94 V-0 (evaluation was ⊙). In addition, the burning rate of the member bonded to polystyrene foam was also slow, and the member passed UL94 HBF (evaluation was ○). In addition, the tensile strength was slightly weak. The relative permittivity was 130 and was suitable as a radio wave absorber, but the performance of the transmission attenuation factor was low, and the noise suppression effect was sufficient and judged as A.

Example 7

Flame-resistant paper for a radio wave absorber member of Example 7 having a basis weight of 185 g/m² was obtained in the same manner as in Example 1 except that the content of pulp was changed to 13 mass %, the content of aluminum hydroxide was changed to 57 mass %, the content of glass fiber was changed to 9 masse, the contents of polyvinyl alcohol fiber and the styrene-acrylic copolymer resin were changed to 8 mass % and 1 mass %, respectively, as binders (the content of the binders was changed to 9 mass %), and the content of guanidine phosphate was changed to 11 mass %. Papermaking productivity was good.

The obtained flame-resistant paper for a radio wave absorber member was evaluated. The results are shown in Table 1. The flame-resistant paper for a radio wave absorber member had a low burning rate and passed UL94 V-0 (evaluation was ⊙). In addition, the burning rate of the member bonded to polystyrene foam was also slow, and the member passed UL94 HBF (evaluation was ⊙). In addition, the tensile strength was also sufficient. The relative permittivity was 130 and was suitable as a radio wave absorber, but the performance of the transmission attenuation factor was low, and the noise suppression effect was Δ.

Example 8

Flame-resistant paper for a radio wave absorber member of Example 8 was obtained in the same manner as in Example 7 except that the basis weight was changed to 225 g/m². The papermaking productivity was judged as B because guanidine phosphate was precipitated on the size press roll, and drying failure was likely to occur.

The configurations and evaluation results of the flame-resistant paper for a radio wave absorber member of Examples 1 to 8 are shown in Table 1. The relative permittivity was 130 and was suitable as a radio wave absorber, but the performance of the transmission attenuation factor was low, and the noise suppression effect was Δ.

cylinder type dryer (drying temperature: 120° C.) of a multi-cylinder type (6 cylinders). As for papermaking productivity, guanidine phosphate was precipitated on the mangle, paper breakage sometimes occurred in a steam cylinder type drier step, and papermaking productivity was judged as B (however, the evaluation was higher than in Example 14 described later).

The obtained flame-resistant paper for a radio wave absorber member was evaluated. The results are shown in Table 2. The flame-resistant paper for a radio wave absorber member had a low burning rate and passed UL94 V-0 (evaluation was ⊙). In addition, the burning rate of the member bonded to polystyrene foam was also slow, and the member passed UL94 HBF (evaluation was ⊙). The tensile strength was slightly weak. The relative permittivity was 130 and was suitable as a radio wave absorber, but the

TABLE 1

|  |  | Unit | Example 1 | Example 2 | Example 3 | Example 4 | Example 5 | Example 6 | Example 7 | Example 8 |
|---|---|---|---|---|---|---|---|---|---|---|
| Recipe | Pulp | mass % | 18 | 15 | 10 | 15 | 12 | 12 | 13 | 13 |
|  | Aluminum hydroxide | mass % | 48 | 45 | 65 | 55 | 52 | 52 | 57 | 57 |
|  | Glass fiber | mass % | 10 | 15 | 5 | 8 | 8 | 8 | 9 | 9 |
|  | Binder | mass % | 10 | 9 | 9 | 6 | 9 | 9 | 9 | 9 |
|  | Conductive substance | mass % | 1 | 1 | 1 | 1 | 1 | 1 | 1 | 1 |
|  | Guanidine phosphate | mass % | 13 | 15 | 10 | 15 | 18 | 18 | 11 | 11 |
| Blending ratio | Content of aluminum hydroxide/content of binder | — | 83/17 | 83/17 | 88/12 | 90/10 | 85/15 | 85/15 | 86/14 | 83/14 |
|  | (Content of aluminum hydroxide + content of guanidine phosphate)/(content of pulp + content of binder) | — | 69/32 | 72/29 | 80/20 | 77/23 | 77/23 | 77/23 | 76/24 | 76/24 |
|  | Basis weight | g/m² | 115 | 115 | 115 | 115 | 85 | 74 | 185 | 225 |
| Flame resistance of flame-resistant paper (UL94 V-0) |  | — | ⊙ | ⊙ | ⊙ | ⊙ | ⊙ | ⊙ | ⊙ | ⊙ |
| Flame resistance of bonded product (UL94 HBF) |  | — | ⊙ | ⊙ | ⊙ | ⊙ | ○ | ○ | ⊙ | ⊙ |
| Relative permittivity |  | — | 130 | 130 | 130 | 130 | 130 | 130 | 130 | 130 |
| Transmission attenuation factor |  | — | Δ | Δ | Δ | Δ | Δ | Δ | Δ | Δ |
| Tensile strength |  | — | ○ | ○ | ○ | ○ | ○ | Δ | ○ | ○ |
| Papermaking productivity |  | — | A | A | A | A | A | B | B | B |

Example 9

Flame-resistant paper for a radio wave absorber member of Example 9 was obtained in the same manner as in Example 1 except that the size press coater was changed to a dip/mangle. Papermaking productivity was judged as A.

The obtained flame-resistant paper for a radio wave absorber member was evaluated. The results are shown in Table 2. The flame-resistant paper for a radio wave absorber member had a low burning rate and passed UL94 V-0 (evaluation was ⊙). In addition, the burning rate of the member bonded to polystyrene foam was also slow, and the member passed UL94 HBF (evaluation was ⊙). In addition, the tensile strength was also sufficient. The relative permittivity was 130 and was suitable as a radio wave absorber, but the performance of the transmission attenuation factor was low, and the noise suppression effect was Δ.

Example 10

Flame-resistant paper for a radio wave absorber member of Example 10 was obtained in the same manner as in Example 9 except that the liquid temperature of the guanidine phosphate aqueous solution was changed to 15° C. and that the gas type infrared dryer was changed to a steam performance of the transmission attenuation factor was low, and the noise suppression effect was Δ.

Example 11

Flame-resistant paper for a radio wave absorber member of Example 11 having a basis weight of 115 g/m² was obtained in the same manner as in Example 9 except that the content of glass fiber was changed to 10.5 mass % and the content of carbon fiber was changed to 0.5 mass %. Papermaking productivity was judged as A.

The obtained flame-resistant paper for a radio wave absorber member was evaluated. The results are shown in Table 2. The flame-resistant paper for a radio wave absorber member had a low burning rate and passed UL94 V-0 (evaluation was ⊙). In addition, the burning rate of the member bonded to polystyrene foam was also slow, and the member passed UL94 HBF (evaluation was ○). In addition, the tensile strength was also sufficient. The relative permittivity was 130 and was suitable as a radio wave absorber, but the performance of the transmission attenuation factor was low, and the noise suppression effect was Δ.

Example 12

Flame-resistant paper for a radio wave absorber member of Example 12 having a basis weight of 115 g/m² was obtained in the same manner as in Example 9 except that the content of pulp was changed to 17 mass %, the content of aluminum hydroxide was changed to 46 mass %, the content of carbon fiber was changed to 5 mass %, and the content of guanidine phosphate was changed to 12 mass %. Papermaking productivity was judged as Δ.

The obtained flame-resistant paper for a radio wave absorber member was evaluated. The results are shown in Table 2. The flame-resistant paper for a radio wave absorber member had a low burning rate and passed UL94 V-0 (evaluation was ⊙). In addition, the burning rate of the member bonded to polystyrene foam was also slow, and the member passed UL94 HBF (evaluation was ○). In addition, the tensile strength was also sufficient. The relative permittivity was 300 and was too high as a radio wave absorber, but the performance of the transmission attenuation factor was high, and the noise suppression effect was ○.

Example 13

Flame-resistant paper for a radio wave absorber member of Example 13 having a basis weight of 115 g/m² was obtained in the same manner as in Example 9 except that the content of pulp was changed to 16 mass %, the content of aluminum hydroxide was changed to 44 mass %, the content of glass fiber was changed to 9 mass %, the content of the binders was changed to 9 mass % (8 mass % of polyvinyl alcohol fiber and 1 mass % of the styrene-acrylic copolymer resin), the content of carbon fiber was changed to 10 mass %, and the content of guanidine phosphate was changed to 12 mass %. Papermaking productivity was judged as Δ.

The obtained flame-resistant paper for a radio wave absorber member was evaluated. The results are shown in Table 2. The flame-resistant paper for a radio wave absorber member had a low burning rate and passed UL94 V-0 (evaluation was ⊙). In addition, the burning rate of the member bonded to polystyrene foam was also slow, and the member passed UL94 HBF (evaluation was ○). In addition, the tensile strength was also sufficient. The relative permittivity was 300 and was too high as a radio wave absorber, but the performance of the transmission attenuation factor was high, and the noise suppression effect was ○.

Example 14

A flame-resistant paper base material for a radio wave absorber member was obtained in the same manner as in Example 1 except that the content of pulp was changed to 15 mass %, the content of aluminum hydroxide was changed to 55 mass %, the content of glass fiber was changed to 8 mass, and the content of the binder was changed to 0 mass %. Guanidine phosphate and a urethane resin (product name: SUPERFLEX 150 (trade name), manufactured by DKS Co., Ltd.) as a binder were contained in the flame-resistant paper base material for a radio wave absorber member in amounts of 15 mass % and 6 mass %, respectively (the content of the binder was 6 mass %), with respect to the entire flame-resistant paper in the same manner as in Example 1, thereby providing flame-resistant paper for a radio wave absorber member of Example 14 having a basis weight of 115 g/m². During papermaking, the paper was sometimes broken, guanidine phosphate and the urethane resin adhered to the roll of the size press coater, and the papermaking productivity was judged as B–.

The obtained flame-resistant paper for a radio wave absorber member was evaluated. The results are shown in Table 2. The flame-resistant paper for a radio wave absorber member had a low burning rate and passed UL94 V-0 (evaluation was ⊙). In addition, the burning rate of the member bonded to polystyrene foam was also slow, and the member passed UL94 HBF (evaluation was ○). On the other hand, the tensile strength was slightly weak. The relative permittivity was 300 and was too high as a radio wave absorber, but the performance of the transmission attenuation factor was high, and the noise suppression effect was).

The configurations and evaluation results of the flame-resistant paper for a radio wave absorber member of Examples 9 to 14 are shown in Table 2.

TABLE 2

| | | Unit | Example 9 | Example 10 | Example 11 | Example 12 | Example 13 | Example 14 |
|---|---|---|---|---|---|---|---|---|
| Recipe | Pulp | mass % | 18 | 18 | 18 | 17 | 16 | 15 |
| | Aluminum hydroxide | mass % | 48 | 48 | 48 | 46 | 44 | 55 |
| | Glass fiber | mass % | 10 | 10 | 10.5 | 10 | 9 | 8 |
| | Binder | mass % | 10 | 10 | 10 | 10 | 9 | 6 |
| | Conductive substance | mass % | 1 | 1 | 0.5 | 5 | 10 | 1 |
| | Guanidine phosphate | mass % | 13 | 13 | 13 | 12 | 12 | 15 |
| Blending ratio | Content of aluminum hydroxide/content of binder | — | 83/17 | 83/17 | 83/17 | 82/18 | 83/17 | 90/10 |
| | (Content of aluminum hydroxide + content of guanidine phosphate)/(content of pulp + content of binder) | — | 69/32 | 69/32 | 69/32 | 68/32 | 69/31 | 77/23 |
| | Basis weight | g/m² | 115 | 115 | 115 | 115 | 115 | 115 |
| Flame resistance of flame-resistant paper (UL94 V-0) | | — | ⊙ | ⊙ | ⊙ | ⊙ | ⊙ | ⊙ |
| Flame resistance of bonded product (UL94 HBF) | | — | ⊙ | ⊙ | ⊙ | ⊙ | ○ | ⊙ |
| Relative permittivity | | — | 130 | 130 | 60 | 300 | 550 | 130 |
| Transmission attenuation factor | | — | Δ | Δ | Δ | ○ | ○ | Δ |
| Tensile strength | | — | ○ | Δ | ○ | ○ | ○ | Δ |
| Papermaking productivity | | — | A | B | A | A | A | B- |

Comparative Example 1

Flame-resistant paper for a radio wave absorber member of Comparative Example 1 having a basis weight of 115 g/m² was obtained in the same manner as in Example 1 except that the content of pulp was changed to 3 mass %, the content of aluminum hydroxide was changed to 73 mass %, the content of glass fiber was changed to 9 mass %, the contents of polyvinyl alcohol fiber and the styrene-acrylic copolymer resin were changed to 4 mass % and 1 mass %, respectively, as binders (the content of the binders was changed to 5 mass %), and the content of guanidine phosphate was changed to 10 mass %. The strength was weak, breakage frequently occurred, production was not possible, and papermaking productivity was judged as C.

The obtained flame-resistant paper for a radio wave absorber member was evaluated. The results are shown in Table 3. The flame-resistant paper for a radio wave absorber member had a low burning rate and passed UL94 V-0 (evaluation was ⊙). In addition, the burning rate of the member bonded to polystyrene foam was also slow, and the member passed UL94 HBF (evaluation was ○). In addition, the tensile strength was weak. The relative permittivity was 130 and was suitable as a radio wave absorber, but the performance of the transmission attenuation factor was low, and the noise suppression effect was Δ.

Comparative Example 2

Flame-resistant paper for a radio wave absorber member of Comparative Example 2 having a basis weight of 115 g/m² was obtained in the same manner as in Example 1 except that the content of pulp was changed to 25 mass %, the content of aluminum hydroxide was changed to 37 mass %, the content of glass fiber was changed to 17 mass %, the contents of polyvinyl alcohol fiber and the styrene-acrylic copolymer resin were changed to 7 mass % and 1 mass %, respectively, as binders (the content of the binders was changed to 8 mass %), and the content of guanidine phosphate was changed to 13 mass %. Papermaking productivity was judged as Δ.

The obtained flame-resistant paper for a radio wave absorber member was evaluated. The results are shown in Table 3. The flame-resistant paper for a radio wave absorber member had a high burning rate and did not pass UL94 V-0 (evaluation was x). The burning rate of the member bonded to polystyrene foam was also high, and the member did not pass UL94 HBF (evaluation was x). The tensile strength was sufficient. The relative permittivity was 130 and was suitable as a radio wave absorber, but the performance of the transmission attenuation factor was low, and the noise suppression effect was Δ.

Comparative Example 3

Flame-resistant paper for a radio wave absorber member of Comparative Example 3 having a basis weight of 115 g/m² was obtained in the same manner as in Example 1 except that the content of pulp was changed to 20 mass %, the content of aluminum hydroxide was changed to 52 mass %, the content of glass fiber was changed to 13 mass %, the contents of polyvinyl alcohol fiber and the styrene-acrylic copolymer resin were changed to 8 mass % and 2 mass %, respectively, as binders (the content of the binders was changed to 10 mass %), and the content of guanidine phosphate was changed to 5 mass %. Papermaking productivity was judged as Δ.

The obtained flame-resistant paper for a radio wave absorber member was evaluated. The results are shown in Table 3. The flame-resistant paper for a radio wave absorber member had a low burning rate and passed UL94 V-0 (evaluation was ⊙). On the other hand, the burning rate of the member bonded to polystyrene foam was high, and the member did not pass UL94 HBF (evaluation was x). The tensile strength was sufficient. The relative permittivity was 130 and was suitable as a radio wave absorber, but the performance of the transmission attenuation factor was low, and the noise suppression effect was Δ.

Comparative Example 4

Flame-resistant paper for a radio wave absorber member of Comparative Example 4 having a basis weight of 133 g/m² was obtained in the same manner as in Example 1 except that the content of pulp was changed to 16 mass %, the content of aluminum hydroxide was changed to 41 mass %, the content of glass fiber was changed to 9 mass %, the contents of polyvinyl alcohol fiber and the styrene-acrylic copolymer resin were changed to 8 mass % and 1 mass %, respectively, as binders (the content of the binders was changed to 9 mass %), and the content of guanidine phosphate was changed to 25 mass %. The papermaking productivity was judged as C because guanidine phosphate was precipitated on the size press coater, and a stable content could not be maintained.

The obtained flame-resistant paper for a radio wave absorber member was evaluated. The results are shown in Table 3. The flame-resistant paper for a radio wave absorber member had a low burning rate and passed UL94 V-0 (evaluation was ⊙). In addition, the burning rate of the member bonded to polystyrene foam was also slow, and the member passed UL94 HBF (evaluation was ⊙). The tensile strength was sufficient. The relative permittivity was 130 and was suitable as a radio wave absorber, but the performance of the transmission attenuation factor was low, and the noise suppression effect was Δ.

Comparative Example 5

Flame-resistant paper for a radio wave absorber member of Comparative Example 5 having a basis weight of 115 g/m² was obtained in the same manner as in Example 1 except that the content of pulp was changed to 20 mass %, the content of aluminum hydroxide was changed to 50 mass %, the content of glass fiber was changed to 14 mass %, and the content of only polyvinyl alcohol fiber was changed to 3 mass % as a binder (the content of the binder was changed to 3 mass %). The strength was weak, breakage frequently occurred, production was not possible, and papermaking productivity was judged as C.

The obtained flame-resistant paper for a radio wave absorber member was evaluated. The results are shown in Table 3. The flame-resistant paper for a radio wave absorber member had a low burning rate and passed UL94 V-0 (evaluation was ⊙). In addition, the burning rate of the member bonded to polystyrene foam was also slow, and the member passed UL94 HBF (evaluation was ⊙). The tensile strength was weak. The relative permittivity was 130 and was suitable as a radio wave absorber, but the performance of the transmission attenuation factor was low, and the noise suppression effect was Δ.

Comparative Example 6

Flame-resistant paper for a radio wave absorber member of Comparative Example 6 having a basis weight of 115 g/m² was obtained in the same manner as in Example 1 except that the content of pulp was changed to 15 mass %, the content of aluminum hydroxide was changed to 48 mass %, the content of glass fiber was changed to 9 mass %, and the contents of polyvinyl alcohol fiber and the styrene-acrylic copolymer resin were changed to 13 mass % and 2 mass %, respectively, as binders (the content of the binders was changed to 15 mass %). Papermaking productivity was judged as Δ.

The obtained flame-resistant paper for a radio wave absorber member was evaluated. The results are shown in Table 3. The flame-resistant paper for a radio wave absorber member had a high burning rate and did not pass UL94 V-0 (evaluation was x). In addition, the burning rate of the member bonded to polystyrene foam was also high, and the member also did not pass UL94 HBF (evaluation was x). The tensile strength was high. The relative permittivity was 130 and was suitable as a radio wave absorber, but the performance of the transmission attenuation factor was low, and the noise suppression effect was Δ.

Comparative Example 7

Flame-resistant paper for a radio wave absorber member of Comparative Example 7 having a basis weight of 115 g/m² was obtained in the same manner as in Example 1 except that the content of pulp was changed to 19 mass % and the content of carbon fiber was changed to 0 mass. Papermaking productivity was judged as Δ.

The obtained flame-resistant paper for a radio wave absorber member was evaluated. The results are shown in Table 3. The flame-resistant paper for a radio wave absorber member had a low burning rate and passed UL94 V-0 (evaluation was ⊙). The burning rate of the member bonded to polystyrene foam was also slow, and the member passed UL94 HBF (evaluation was ⊙). The tensile strength was sufficient. The relative permittivity was 4, which was low and unsuitable for a radio wave absorber. In addition, the performance of the transmission attenuation factor was low, the noise suppression effect was not obtained, and the evaluation was x.

Comparative Example 8

Flame-resistant paper for a radio wave absorber member of Comparative Example 8 having a basis weight of 115 g/m² was obtained in the same manner as in Example 14 except that the content of pulp was changed to 17 mass %, the content of aluminum hydroxide was changed to 54 mass %, the content of glass fiber was changed to 13 mass %, the content of a binder composed of a urethane resin was changed to 2 mass % (the content of the binder was changed to 2 mass %), and the content of guanidine phosphate was changed to 13 mass %. At the time of papermaking, the paper was broken at the time of winding in guanidine phosphate impregnation, and the papermaking productivity was judged as C.

The obtained flame-resistant paper for a radio wave absorber member was evaluated. The results are shown in Table 3. The flame-resistant paper for a radio wave absorber member had a low burning rate and passed UL94 V-0 (evaluation was ⊙). The burning rate of the member bonded to polystyrene foam was also slow, and the member passed UL94 HBF (evaluation was ⊙). The tensile strength was weak. The relative permittivity was 130 and was suitable as a radio wave absorber, but the performance of the transmission attenuation factor was low, and the noise suppression effect was Δ.

TABLE 3-1

|  |  | Unit | Comparative Example 1 | Comparative Example 2 | Comparative Example 3 | Comparative Example 4 |
|---|---|---|---|---|---|---|
| Recipe | Pulp | mass % | 3 | 25 | 20 | 16 |
|  | Aluminum hydroxide | mass % | 73 | 37 | 52 | 41 |
|  | Glass fiber | mass % | 9 | 17 | 13 | 9 |
|  | Binder | mass % | 5 | 8 | 10 | 9 |
|  | Conductive substance | mass % | 1 | 1 | 1 | 1 |
|  | Guanidine phosphate | mass % | 10 | 13 | 5 | 25 |
| Blending ratio | Content of aluminum hydroxide/content of binder | — | 94/6 | 82/18 | 84/16 | 82/18 |
|  | (Content of aluminum hydroxide + content of guanidine phosphate)/(content of pulp + content of binder) | — | 91/9 | 60/40 | 66/35 | 73/28 |
|  | Basis weight | g/m² | 115 | 115 | 115 | 133 |
| Flame resistance of flame-resistant paper (UL94 V-0) |  | — | ⊙ | X | ⊙ | ⊙ |
| Flame resistance of bonded product (UL94 HBF) |  | — | ○ | X | X | ⊙ |
| Relative permittivity |  | — | 130 | 130 | 130 | 130 |
| Transmission attenuation factor |  | — | Δ | Δ | Δ | Δ |
| Tensile strength |  | — | X | ○ | ○ | ○ |
| Papermaking productivity |  | — | C | A | A | C |

TABLE 3-2

|  |  | Unit | Comparative Example 5 | Comparative Example 6 | Comparative Example 7 | Comparative Example 8 |
|---|---|---|---|---|---|---|
| Recipe | Pulp | mass % | 20 | 15 | 19 | 17 |
|  | Aluminum hydroxide | mass % | 50 | 48 | 48 | 54 |
|  | Glass fiber | mass % | 14 | 9 | 10 | 13 |

TABLE 3-2-continued

|  |  | Unit | Comparative Example 5 | Comparative Example 6 | Comparative Example 7 | Comparative Example 8 |
|---|---|---|---|---|---|---|
| | Binder | mass % | 3 | 15 | 10 | 2 |
| | Conductive substance | mass % | 1 | 1 | 0 | 1 |
| | Guanidine phosphate | mass % | 13 | 13 | 13 | 13 |
| Blending ratio | Content of aluminum hydroxide/content of binder | — | 94/6 | 76/24 | 83/17 | 96/4 |
| | (Content of aluminum hydroxide + content of guanidine phosphate)/(content of pulp + content of binder) | — | 73/27 | 67/33 | 68/32 | 78/22 |
| | Basis weight | $g/m^2$ | 115 | 115 | 115 | 115 |
| Flame resistance of flame-resistant paper (UL94 V-0) | | — | ◎ | X | ◎ | ◎ |
| Flame resistance of bonded product (UL94 HBF) | | — | ◎ | X | ◎ | ◎ |
| Relative permittivity | | — | 130 | 130 | 4 | 130 |
| Transmission attenuation factor | | — | Δ | Δ | X | Δ |
| Tensile strength | | — | X | O | O | X |
| Papermaking productivity | | — | C | A | A | C |

In Examples 1 to 14, it was possible to obtain flame-resistant paper for a radio wave absorber member having excellent flame resistance of the flame-resistant paper for a radio wave absorber member, flame resistance of a member obtained by bonding the flame-resistant paper for a radio wave absorber member and polystyrene foam, tensile strength, and papermaking productivity.

On the other hand, in Comparative Example 1, the tensile strength was also weak, and stable production was not possible. Further, Comparative Examples 2 and 3 offered excellent tensile strength but were inferior in flame resistance of the flame-resistant paper for a radio wave absorber member and the bonded product. Comparative Example 4 offered excellent flame resistance but slightly weak tensile strength, and stable production was not possible. In Comparative Example 5, although the flame resistance of the flame-resistant paper for a radio wave absorber member and the bonded product was excellent, the tensile strength was weak, and stable production was difficult. In Comparative Example 6, although the tensile strength was strong and the stable productivity was excellent, the flame resistance of the flame-resistant paper for a radio wave absorber member and the bonded product was poor. In Comparative Example 7, although the productivity and the flame resistance were excellent, the relative permittivity and the transmission attenuation factor were small, and the radio wave absorbability was poor. Comparative Example 8 offered excellent radio wave absorption performance and flame resistance but weak tensile strength, and stable production was not possible.

The invention claimed is:

1. A flame-resistant paper for a radio wave absorber member, comprising:
   pulp in an amount of 5 to 20 mass %,
   aluminum hydroxide is in an amount of 40 to 70 mass %,
   guanidine phosphate is in an amount of 10 to 20 mass %,
   binder in an amount of 5 to 10 mass %, and
   conductive substance is in an amount of 0.1 to 12 mass %,
   wherein a mass ratio of the aluminum hydroxide to the binder (content of aluminum hydroxide/content of binder) is 83/17 to 91/9, and
   wherein a mass ratio of the aluminum hydroxide and the guanidine phosphate to the pulp and the binder (content of aluminum hydroxide+content of guanidine phosphate)/(content of pulp+content of binder) is 67/33 to 80/20,
   with a result that tensile strength and toughness of the flame-resistant paper is improved.

2. The flame-resistant paper for a radio wave absorber member according to claim 1, wherein the conductive substance is conductive fiber.

3. The flame-resistant paper for a radio wave absorber member according to claim 2, wherein the conductive fiber is present in an amount of 0.5 to 2 mass %, and a relative permittivity is 10 to 250.

4. The flame-resistant paper for a radio wave absorber member according to claim 2, wherein the conductive fiber is present in an amount of 5 to 12 mass %, and a transmission attenuation factor is 20 dB or more.

5. The flame-resistant paper for a radio wave absorber member according to claim 1, having a basis weight of 80 to 200 $g/m^2$.

6. The flame-resistant paper for a radio wave absorber member according to claim 1, wherein the binder is at least one selected from the group consisting of a polyvinyl alcohol resin, an acrylic resin, and a styrene-acrylic copolymer resin.

7. A production method for the flame-resistant paper for a radio wave absorber member according to claim 1, comprising in this order:
   preparing a slurry including pulp, aluminum hydroxide, a binder, and a conductive substance,
   performing wet papermaking using the slurry to provide a flame-resistant paper base material for a radio wave absorber member, and
   impregnating the flame-resistant paper base material for a radio wave absorber member with an aqueous solution containing guanidine phosphate.

8. The production method for the flame-resistant paper for a radio wave absorber member according to claim 7, further comprising in this order after the impregnating the flame-resistant paper base material for a radio wave absorber member with the aqueous solution containing guanidine phosphate:
   pressurizing the flame-resistant paper base material for a radio wave absorber member; and
   drying the flame-resistant paper base material for a radio wave absorber member at a temperature of 80 to 170° C.

* * * * *